(12) United States Patent
Chiang et al.

(10) Patent No.: US 7,924,088 B1
(45) Date of Patent: Apr. 12, 2011

(54) OFFSET VOLTAGE CALIBRATION METHOD AND APPARATUS AND AMPLIFIER THEREOF (75) Inventors: Yu-Chen Chiang, Changhua County (TW); Ming-Hung Chang, Hsin-Chu Hsien (TW); Fu-Yuan Chen, Kao-Hsiung Hsien (TW)

(73) Assignee: Anpec Electronics Corporation, Hsin-Chu (TW)

( * ) Notice: Subject to any disclaimer, the term of this patent is extended or adjusted under 35 U.S.C. 154(b) by 8 days.

(21) Appl. No.: 12/641,268

(22) Filed: Dec. 17, 2009

(30) Foreign Application Priority Data

Sep. 29, 2009 (TW) ................ 98132885 A (51) Int. Cl.
*H03F 1/02* (2006.01)
(52) U.S. Cl. .......................................... 330/9; 330/279
(58) Field of Classification Search .............. 330/9, 279, 330/254, 69
See application file for complete search history.

(56) References Cited

U.S. PATENT DOCUMENTS

| 5,061,900 | A   | * | 10/1991 | Vinn et al. ........................ 330/9 |
| 6,897,700 | B1  | * | 5/2005  | Fu et al. ........................ 327/307 |
| 7,514,978 | B2  | * | 4/2009  | Smelloy et al. ............... 327/307 |
| 7,532,065 | B2  | * | 5/2009  | Chen et al. ........................ 330/9 |
| 7,755,421 | B2  | * | 7/2010  | Chen et al. ........................ 330/9 |
| 2009/0302923 | A1 | * | 12/2009 | Smeloy et al. ................ 327/307 |

* cited by examiner

*Primary Examiner* — Henry K Choe
(74) *Attorney, Agent, or Firm* — Winston Hsu; Scott Margo (57) ABSTRACT

An offset voltage calibration method is disclosed, which is utilized for calibrating an offset voltage of an electronic device during a calibration period. The offset voltage calibration method includes generating a control signal according to an output signal of the electronic device, counting a count value and generating an offset indication signal according to the control signal, stopping counting and generating a final count value according to a compensation value after the output signal changes state, generating a calibration signal according to the count value or the final count value, and calibrating the offset voltage according to the offset indication signal and the calibration signal.

29 Claims, 8 Drawing Sheets

OFFSET VOLTAGE CALIBRATION METHOD AND APPARATUS AND AMPLIFIER THEREOF

BACKGROUND OF THE INVENTION

1. Field of the Invention

The present invention relates to an offset voltage calibration method and related apparatus and amplifier, and more particularly, to an offset voltage calibration method capable of precisely reducing the effect of input offset voltage and related apparatus and amplifier.

2. Description of the Prior Art

An operational amplifier is an important component of all kinds of circuits, such as analog-to-digital converters, charge pumps, filters, buffers, etc. Due to fabrication process variations or material factors, the operational amplifier may have certain non-ideal characteristics. For example, an ideal operational amplifier can provide zero output voltage with zero differential input voltage. However, output voltage of a practical operational amplifier may be non-zero for zero differential input voltage in practice. In other words, the practical operational amplifier has a direct current (DC) input offset voltage due to non-ideal factors, resulting in the output of the operational amplifier being nonzero with zero differential input voltage. Therefore, the DC input offset voltage effect will reduce the precision of the operational amplifier. If the DC input offset voltage is too great, the offset effect may seriously affect overall circuit performance.

To eliminate the input offset voltage of the operational amplifier, the prior art has presented many offset voltage calibration methods and related devices for performing an offset voltage calibration process. In general, the offset voltage calibration process can be performed during the integrated circuit (IC) manufacturing process, such as at a chip probing (CP) or final testing (FT) stage. The offset voltage calibration process can also be performed by external components for reducing the offset effect. Additionally, the offset voltage calibration process can be performed through the amplifier circuit internal to the IC according to a predetermined operation sequence, which is usually called auto-calibration.

Figure 1:
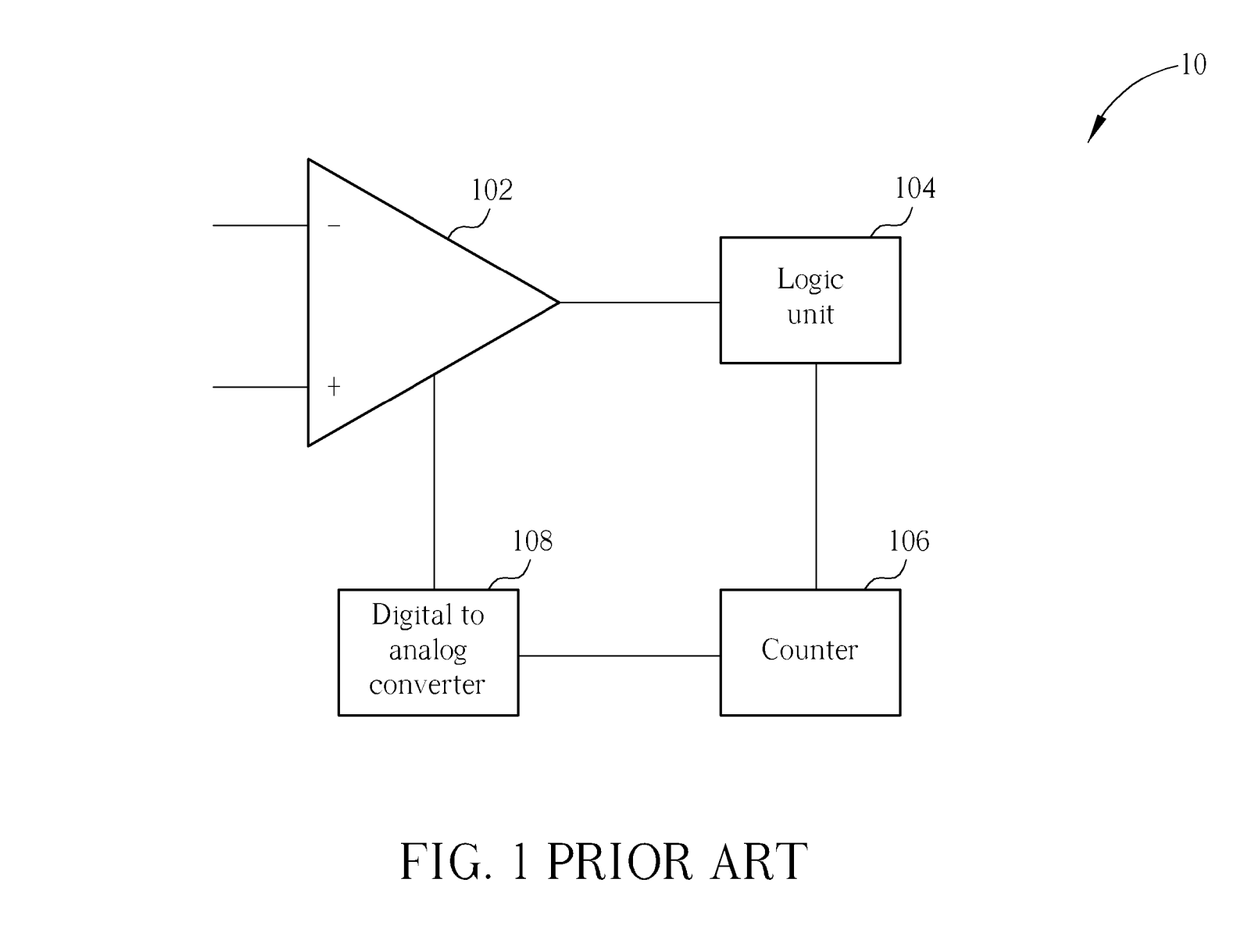
FIG. 1 is a schematic diagram of an offset voltage calibration system according to the prior art.

For example, please refer to FIG. 1, which is a schematic diagram of an offset voltage calibration system 10 according to the prior art. The offset voltage calibration system 10 utilizes a digital trimming calibration method to overcome the offset voltage effect. The amount of offset error caused by the input offset voltage is often represented as a proportion of the input offset voltage to the amount of voltage variation value of a single least significant bit (LSB), which is represented in LSB. As shown in FIG. 1, when the offset voltage calibration system 10 is operated in a calibration mode, a logic unit 104 controls a counter 106 and a digital-to-analog converter 108 to progressively adjust the internal circuitry of an operational amplifier 102 to decrease the input offset voltage according to the output situation of the operational amplifier 102 until the output of the operational amplifier 102 is changed from high (low) logic level to low (high) logic level, i.e. a state change operation occurs. However, the smaller input offset voltage can not be amplified enough at the output of the operational amplifier 102 in the last stage of the calibration process due to finite open loop gain, so that the logic unit 104 can not accurately judge the state change operation of the operational amplifier 102. In such a condition, the calibrated input offset voltage which had been already adjusted to an empty zone nearby the zero offset point may be over-calibrated by another one LSB, thus the calibrated input offset voltage adjusted to the empty zone will be further calibrated to an error zone instead, resulting in an over-calibrated and inaccurate calibration process. On the other hand, when voltage value of the input offset voltage approaches zero, such as less than 1 LSB, the speed of the state change operation may be less than both clock speed of the counter 106 and the digital-to-analog converter 108, which means that the state change operation of the operational amplifier 102 becomes very slow and cannot be completed in one clock period. In other words, the counter 106 continues to count and then the over-calibrated situation occurs during the duration of the change state operation of the operational amplifier 102. As a result, the range of the empty zone and the error zone may be enlarged so as to increase the distribution of the input offset voltage. Therefore, the conventional method is not capable of achieving an accurate calibration result effectively.

Figure 2:
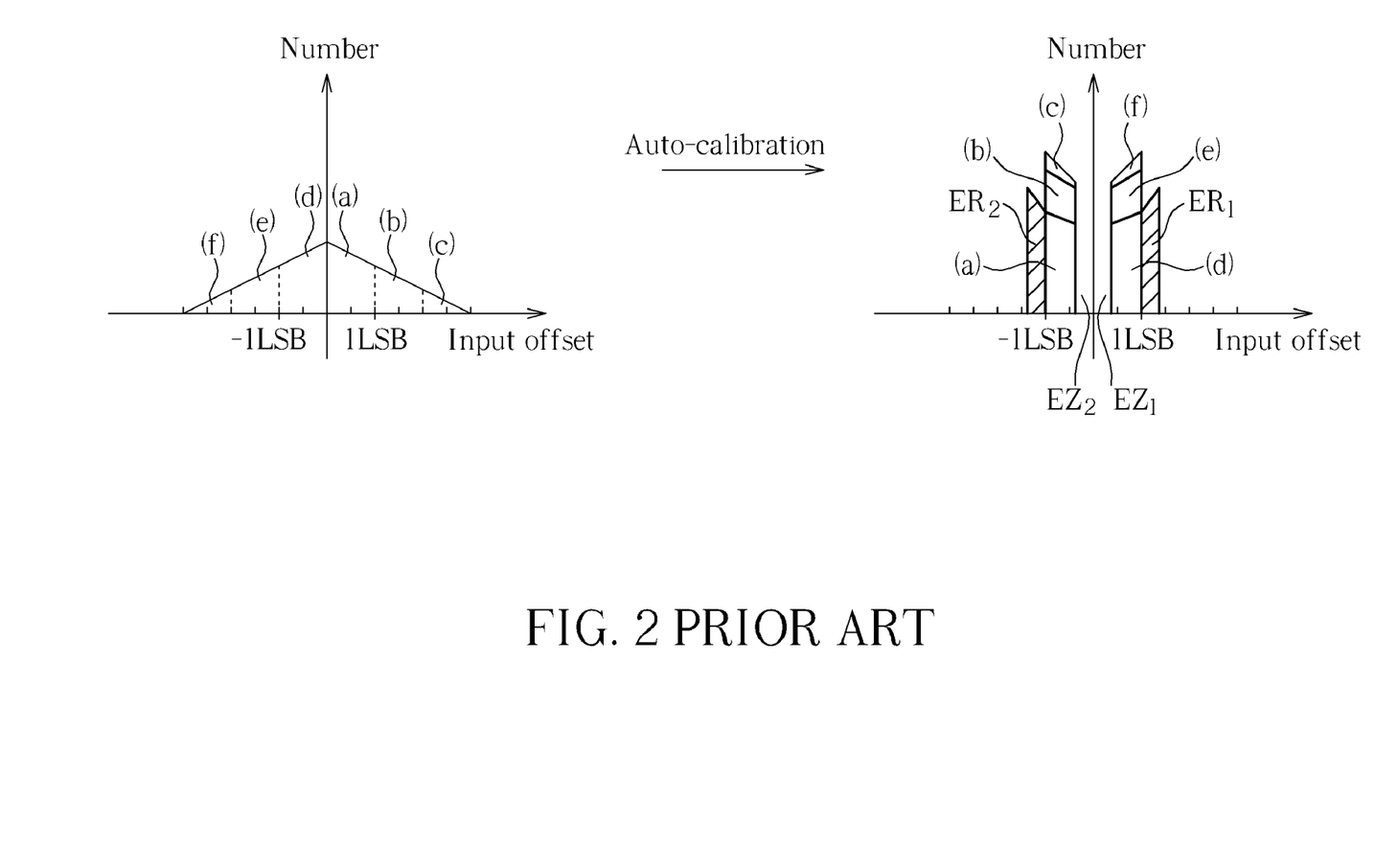
FIG. 2 is a schematic diagram illustrating distribution of input offset voltage according to the prior art.

Please refer to FIG. 2, which is a schematic diagram illustrating the distribution of input offset voltage according to the prior art. Through the above-mentioned calibration process of the offset voltage calibration system 10, when the input offset voltage falls within the empty zone $EZ_1$, i.e. the voltage value of the (calibrating) input offset voltage is small enough, the logic unit 104 can not accurately judge whether the state change operation of the operational amplifier 102 is done, causing an incorrect judgment, so that the calibration process continues even if the state change operation has finished. Or, because the state change operation of the operational amplifier 102 occurs too slowly and can not be completed in one clock period, the counter 106 keeps on counting, resulting in over-calibration. In such a condition, as shown in FIG. 2, the input offset voltage calibrated into the range of the empty zone $EZ_1$ may be over-calibrated by one extra LSB to the error zone $ER_1$, so that the distribution of the input offset voltage can not be concentrated at zero offset point and further create an empty zone offset. In short, the effect of the input offset voltage can not be effectively minimized by the calibration process of the offset voltage calibration system 10, and this may affect performance and application range of the amplifier 102.

SUMMARY OF THE INVENTION

It is therefore an objective of the present invention to provide an offset voltage calibration method and related apparatus and amplifier.

The present invention discloses an offset voltage calibration method for calibrating an offset voltage of an electronic device during a calibration period, which comprising generating a control signal according to an output signal of the electronic device; counting a count value and generating an offset indication signal according to the control signal; stopping counting the count value and adjusting the count value according to a compensation value to generate a final count value after the output signal changes state; generating a calibration signal according to the count value or the final count value; and calibrating the offset voltage according to the offset indication signal and the calibration signal.

The present invention further discloses an offset voltage calibration apparatus for calibrating an offset voltage of an electronic device during a calibration period, which comprises a logic control unit, a counting unit, a calibration signal generation unit, and a regulating unit. The logic control unit is utilized for generate a control signal according to an output signal of the electronic device. The counting unit is coupled to the logic control unit for counting a count value and generating an offset indication signal according to the control signal, stopping counting the count value and adjusting the count value according to a compensation value to generate a final count value after the output signal changes state. The calibration signal generation unit is coupled to the counting unit for generating a calibration signal according to the count value or the final count value. The regulating unit is coupled to the counting unit, the calibration signal generation unit, and the electronic device for calibrating the offset voltage according to the offset indication signal and the calibration signal.

The present invention further discloses an amplifier capable of auto-calibrating offset voltage, which comprises an input stage, a gain stage circuit, and an offset voltage calibration apparatus. The input stage comprises a first input end and a second input end and is utilizes for receiving an common mode voltage signal respectively during a calibration period The gain stage circuit is coupled to the input stage for generating an output signal according to the common mode voltage signal received by the first input end and the second input end. The offset voltage calibration apparatus is utilized for calibrating an offset voltage of the amplifier device during the calibration period, which comprises a logic control unit, a counting unit, a calibration signal generation unit, and a regulating unit. The logic control unit is coupled to the gain stage circuit for generate a control signal according to the output signal. The counting unit is coupled to the logic control unit for counting a count value and generating an offset indication signal according to the control signal, stopping counting the count value and adjusting the count value according to a compensation value to generate a final count value after the output signal changes state. The calibration signal generation unit is coupled to the counting unit for generating a calibration signal according to the count value or the final count value. The regulating unit is coupled to the counting unit, the calibration signal generation unit, and the gain stage circuit for calibrating the offset voltage according to the offset indication signal and the calibration signal.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
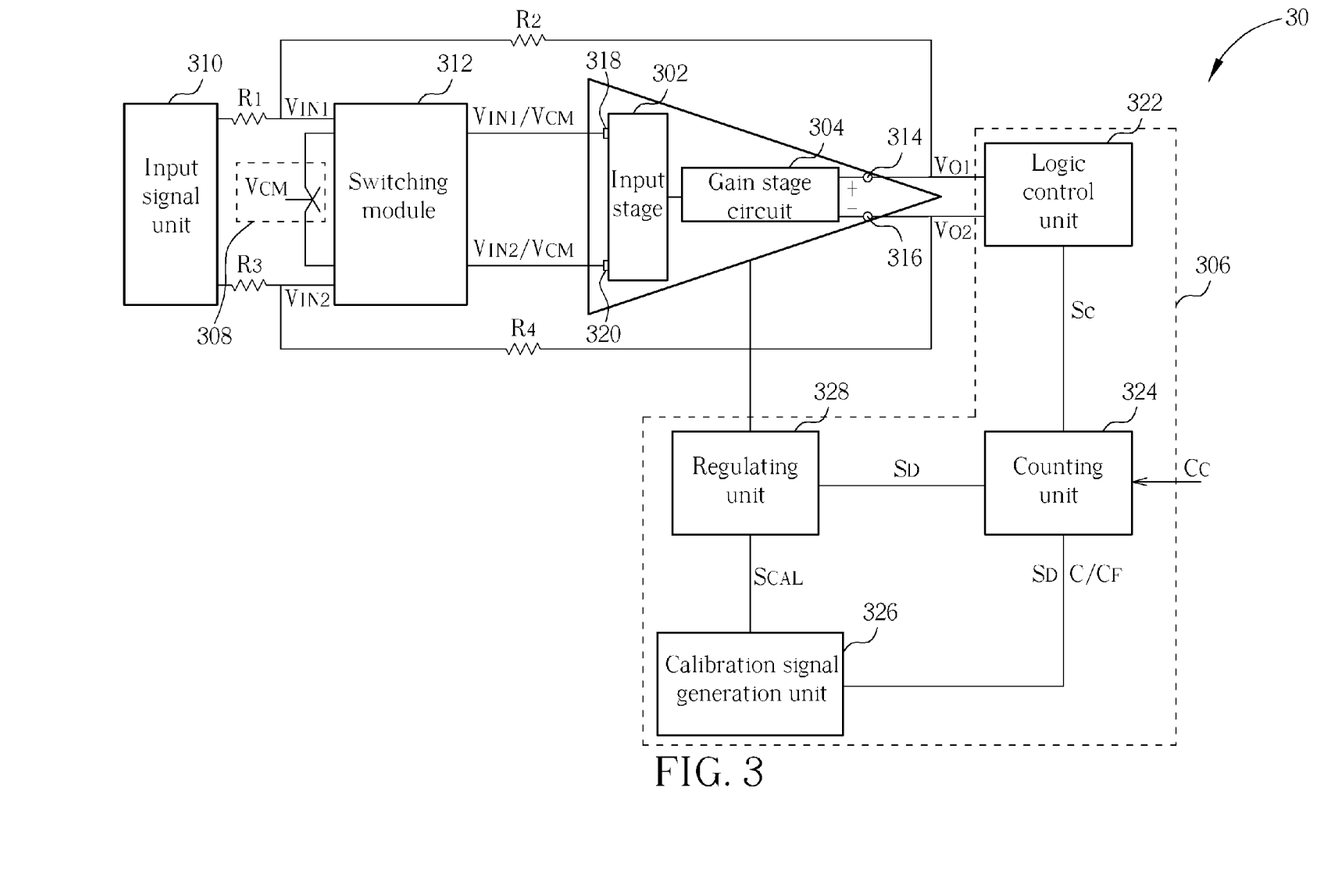
FIG. 3 is a schematic diagram of an amplifier capable of auto-calibrating offset voltage according to an embodiment of the present invention.

Please refer to FIG. 3, which is a schematic diagram of an amplifier 30 capable of auto-calibrating offset voltage according to an embodiment of the present invention. The amplifier 30 includes an input stage 302, a gain stage circuit 304, and an offset voltage calibration apparatus 306. Please note that even with zero differential input voltage from the input stage 302, the gain stage circuit 304 outputs a certain amount of DC voltage. In other words, the gain stage circuit 304 has a DC input offset voltage. In such a condition, the amplifier 30 is capable of calibrating the input offset voltage of the gain stage circuit 304 through the offset voltage calibration apparatus 306 to reduce the effect of the DC offset.

Moreover, the amplifier 30 further includes a common mode input unit 308, an input signal unit 310, a switching module 312, a first output end 314, and a second output end 316. In the embodiment of the invention, the amplifier 30 utilizes the switching module 312 to switch the operation state of the gain stage circuit 304 between a normal mode and a calibration mode. The common mode input unit 308 is utilized for providing a common mode voltage signal $V_{CM}$. The input signal unit 310 is utilized for receiving and providing a first input signal $V_{IN1}$ and a second input signal $V_{IN2}$. As shown in FIG. 3, the gain stage circuit 304 is coupled to the first output end 314 and second output end 316 and is able to output a first output signal $V_{O1}$ and a second output signal $V_{O2}$ to the offset voltage calibration apparatus 306 through the first output end 314 and second output end 316, respectively. On the other hand, the switching module 312 conducts the connection between the input stage 302 and the input signal unit 310 to provide the first input signal $V_{IN1}$ and the second signal $V_{IN2}$ to the gain stage circuit 304 via the first input end 318 and the second input end 320, respectively, during a normal period, i.e. when the amplifier 30 operates in the normal mode. Thus, the gain stage circuit 304 is able to implement normal amplifier functions according to the first input signal $V_{IN1}$ and the second input signal $V_{IN2}$. In addition, resistors $R_1$, $R_2$, $R_3$, and $R_4$ are capable of determining gain and bandwidth of the amplifier 30, and this is not limited; those skilled in the art can make alternations and modifications accordingly.

Otherwise, the amplifier 30 can be set to enter a calibration period to perform a calibration operation while any calibration requirement exists, such as at power-up or power-on reset. As a result, the switching module 312 can conduct the connection between the input stage 302 and the common mode input unit 308 during the calibration period to provide the common mode voltage signal $V_{CM}$ to the first input end 318 and the second input end 320, respectively. In other words, the gain stage circuit 304 can be switch into an open loop configuration, and the voltage level on the first input end 318 and the second input end 320 are identical to the common mode voltage signal $V_{CM}$ with a virtual short connection. In such a condition, the gain stage circuit 304 may operate as a comparator, and the voltage level of the first output signal $V_{O1}$ and the second output signal $V_{O2}$ can be used for representing the input offset voltage of the gain stage circuit 304. For example, when the gain stage circuit 304 has a positive input offset voltage, the first output signal $V_{O1}$ is at a high logic level (1) and the second output signal $V_{O2}$ is at a low logic level (0). Conversely, when the gain stage circuit 304 has a negative input offset voltage, the first output signal $V_{O1}$ is at a low logic level (0) and the second output signal $V_{O2}$ is at a high logic level (1).

Furthermore, the offset voltage calibration apparatus 306 is capable of performing an accurate calibration process for the gain stage circuit 304 under the abovementioned setting during the calibration period. The offset voltage calibration apparatus 306 includes a logic control unit 322, a counting unit 324, a calibration signal generation unit 326, and a regulating unit 328. As shown in FIG. 3, the logic control unit 322 is coupled to the first output end 314, the second output end 316, and the counting unit 324 for generating a control signal $S_C$ according to the first output signal $V_{O1}$ and the second output signal $V_{O2}$. Preferably, the logic control unit 322 can determine offset situation of the input offset voltage of the gain stage circuit 304 according to logic state of the first output signal $V_{O1}$ and the second output signal $V_{O2}$, and generate the control signal $S_C$ accordingly for the following calibration process. The counting unit 324 is coupled to the logic control unit 322, the calibration signal generation unit 326, and the regulating unit 328 for counting a count value C and generating an offset indication signal $S_D$ according to the control signal $S_C$. The calibration signal generation unit 326 is coupled to the counting unit 324 and the regulating unit 328 for generating a calibration signal $S_{CAL}$ according to the count value C before the change state operation of the gain stage circuit 304 occurs or according to the final count value $C_F$ after the change state operation of the gain stage circuit 304 occurs. The regulating unit 328 is coupled to the counting unit 324, the calibration signal generation unit 326, and the gain stage circuit 304 for adjusting the gain stage circuit 304 to calibrate the offset voltage according to the offset indication signal $S_D$ and the calibration signal $S_{CAL}$. Thus, when a positive input offset voltage occurs, the counting unit 324 and the calibration signal generation unit 326 generate the corresponding offset indication signal $S_D$ and the calibration signal $S_{CAL}$ according to the control signal $S_C$, respectively, so that the regulating unit 328 can calibrate the input offset voltage accordingly for minimizing the effect of the input offset voltage. The regulating unit 328 is able to progressively reduce the DC input offset voltage through iterative feedback to achieve zero offset. When a negative input offset voltage occurs, the amplifier 30 can perform the calibration process by the same token. Furthermore, in the amplifier 30, when the first output signal $V_{O1}$ and the second output signal $V_{O2}$ change state, the counting unit 324 stops the counting operation and adjusts the count value C according to a compensation value $C_C$ in order to generate a final count value $C_F$. Preferably, the compensation value $C_C$ can be less than or equal to one least significant bit, and this should not be a limitation of the present invention. As a result, the invention is capable of obtaining the lowest input offset voltage without producing the empty zone, so that the invention can achieve a more precise calibration result compared with the prior art.

Figure 4:
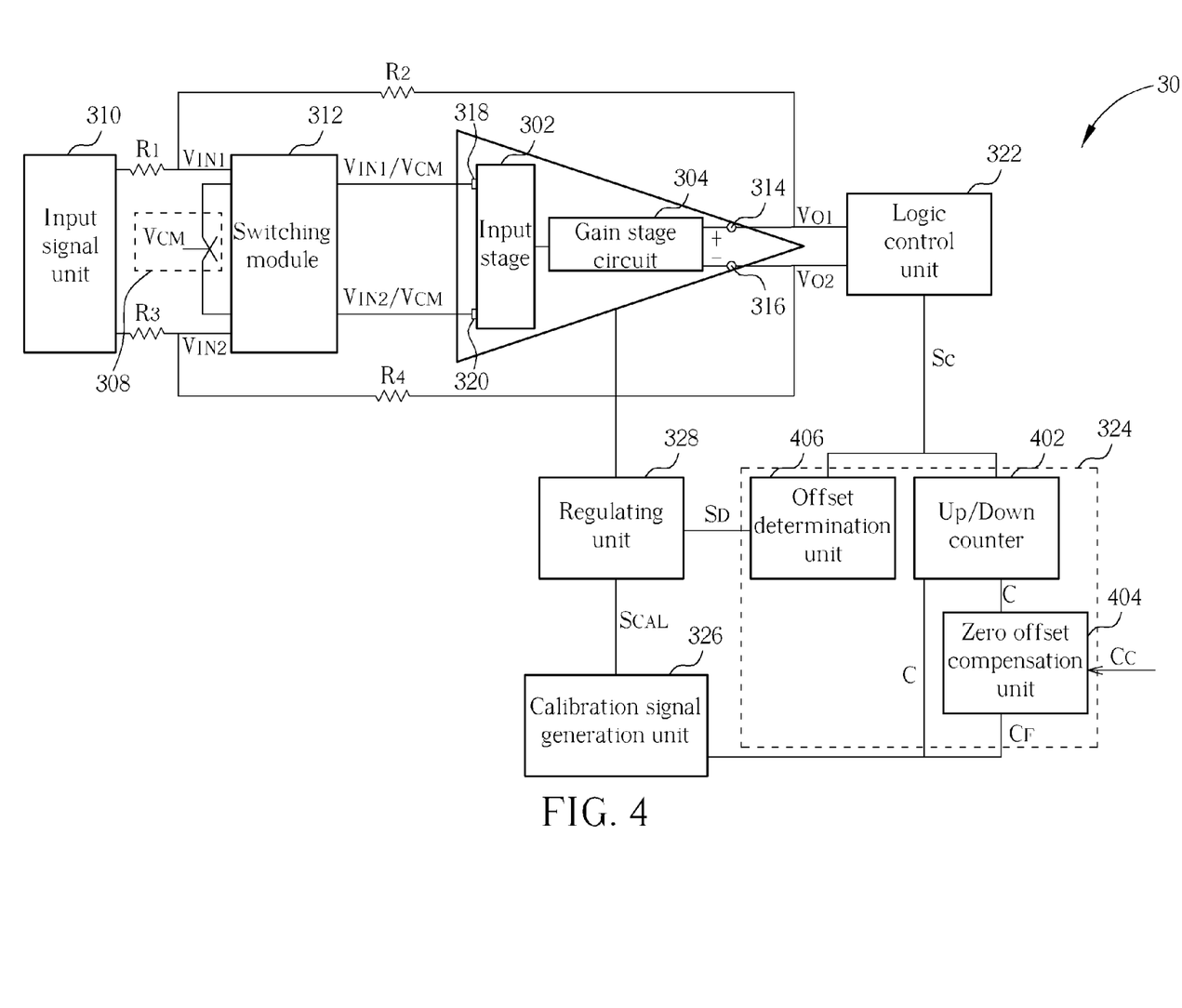
FIG. 4 is a schematic diagram of the counting unit shown in FIG. 3 according to an embodiment of the present invention.

Further description associated with operation of the counting unit 324 is now presented in conjunction with FIG. 4. FIG. 4 is a schematic diagram of the counting unit 324 shown in FIG. 3 according to an embodiment of the present invention. The counting unit 324 includes an up/down counter 402, a zero offset compensation unit 404, and an offset determination unit 406. The up/down counter 402 is coupled to the logic control unit 322, the calibration signal generation unit 326, and the zero offset compensation unit 404 for selectively up-counting or down-counting the count value C according to the control signal $S_C$. For example, the up/down counter 402 can up-count or down-count by one increment or decrement, such as 1 LSB at a time, with a corresponding clock. Moreover, the up/down counter 402 stops counting the count value C when the first output signal $V_{O1}$ and the second output signal $V_{O2}$ change state. After that, the zero offset compensation unit 404 coupled to the up/down counter 402 and the calibration signal generation unit 326 can be utilized for generating the final count value $C_F$ according to the count value C and the compensation value $C_C$. In such a case, the final count value $C_F$ is equal to the difference of the count value C and the compensation value $C_C$ if the up/down counter 402 up-counts the count value C before the output signal changes state, and the final count value $C_F$ is equal to the sum of the compensation value $C_C$ and the count value C when the up/down counter 402 down-counts the count value C before the output signal changes state. The offset determination unit 406 is coupled to the logic control unit 322 for generating the offset indication signal $S_D$ according to the control signal $S_C$ to indicate offset direction of the input offset voltage for the regulating unit 328. In addition, the compensation value $C_C$ can be utilized for compensating the over-calibrated result and reducing allowable offset value of the offset voltage calibration apparatus 306. For example, the compensation value $C_C$ can be equal to the sum of size of an error calibrated zone (error zone) and half of resolution of the gain stage circuit 304. In such a condition, the compensation value $C_C$ can be concerned with the input offset voltage originally over-calibrated from an empty zone to the error zone and with allowable offset range of the gain stage circuit 304. Taking an amplifier device having an input resolution of 1 LSB as an example, if the amplifier device were found to have a calibration error situation when the input offset voltage is less than 0.4 LSB, the size of an error correction zone can be set to 0.4 LSB. Therefore, the compensation value $C_C$ can be expressed as $$C_c = 0.4 LSB + \frac{1 LSB}{2} = 0.9 LSB.$$

The above-mentioned setting of the compensation value $C_C$ is merely an exemplary embodiment of the present invention, and should not be a limitation of the present invention. Those skilled in the art should appreciate that various modifications of the compensation value could be made according to characteristics of the applied amplifier for performing calibration compensation.

Figure 5:
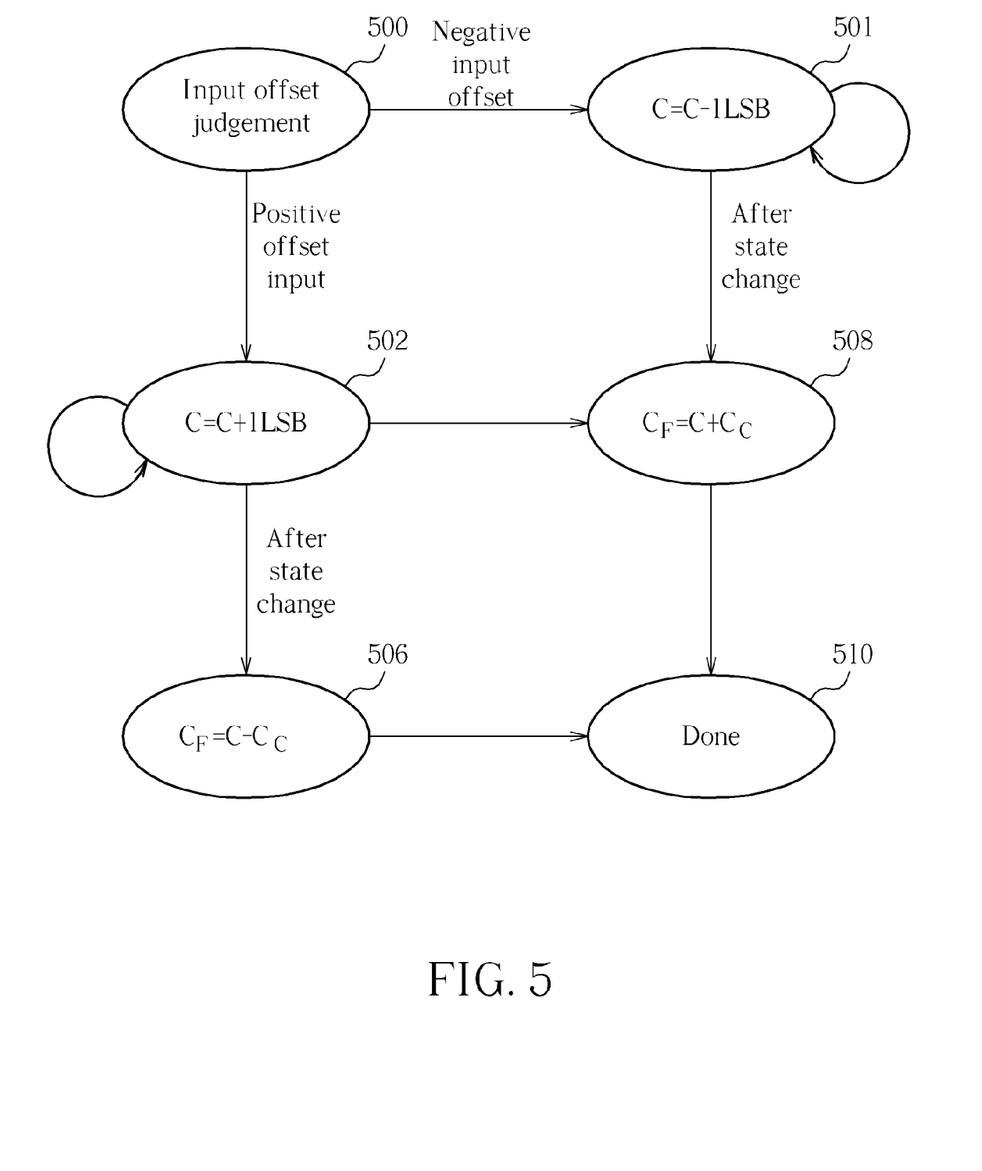
FIG. 5 is a state diagram illustrating the operation of the counting unit shown in FIG. 3 according to an embodiment of the present invention.

Please refer to FIG. 5. FIG. 5 is a state diagram illustrating the operation of the counting unit 324 shown in FIG. 3 according to an embodiment of the present invention, which comprises the following states:

State 500: The logic control unit 322 generates the control signal $S_C$ to indicate offset situation of the input offset voltage for the counting unit 324 when the gain stage circuit 304 outputs the first output signal $V_{O1}$ and the second output signal $V_{O2}$. The counting unit 324 generates the offset indication signal $S_D$ accordingly. When a positive input offset voltage occurs, go to State 502; otherwise, when a negative input offset voltage occurs, go to State 504.

State 502: The counting unit 324 up-counts by one increment with the corresponding clock. After the output signal changes state, go to State 506.

State 504: The counting unit 324 down-counts by one decrement with the corresponding clock. After the output signal changes state, go to State 508.

State 506: The counting unit 324 performs subtraction between the count value C and the compensation value $C_C$ to calculate the final count value $C_F$. After that, go to State 510.

State 508: The counting unit 324 performs addition on count value C and the compensation value $C_C$ to calculate the final count value $C_F$. After that, go to State 510.

State 510: The offset calibration process is done, the counting unit 324 outputs a lock indication signal for indicating the gain stage circuit 304 to perform the normal amplifier operation.

Figure 6:
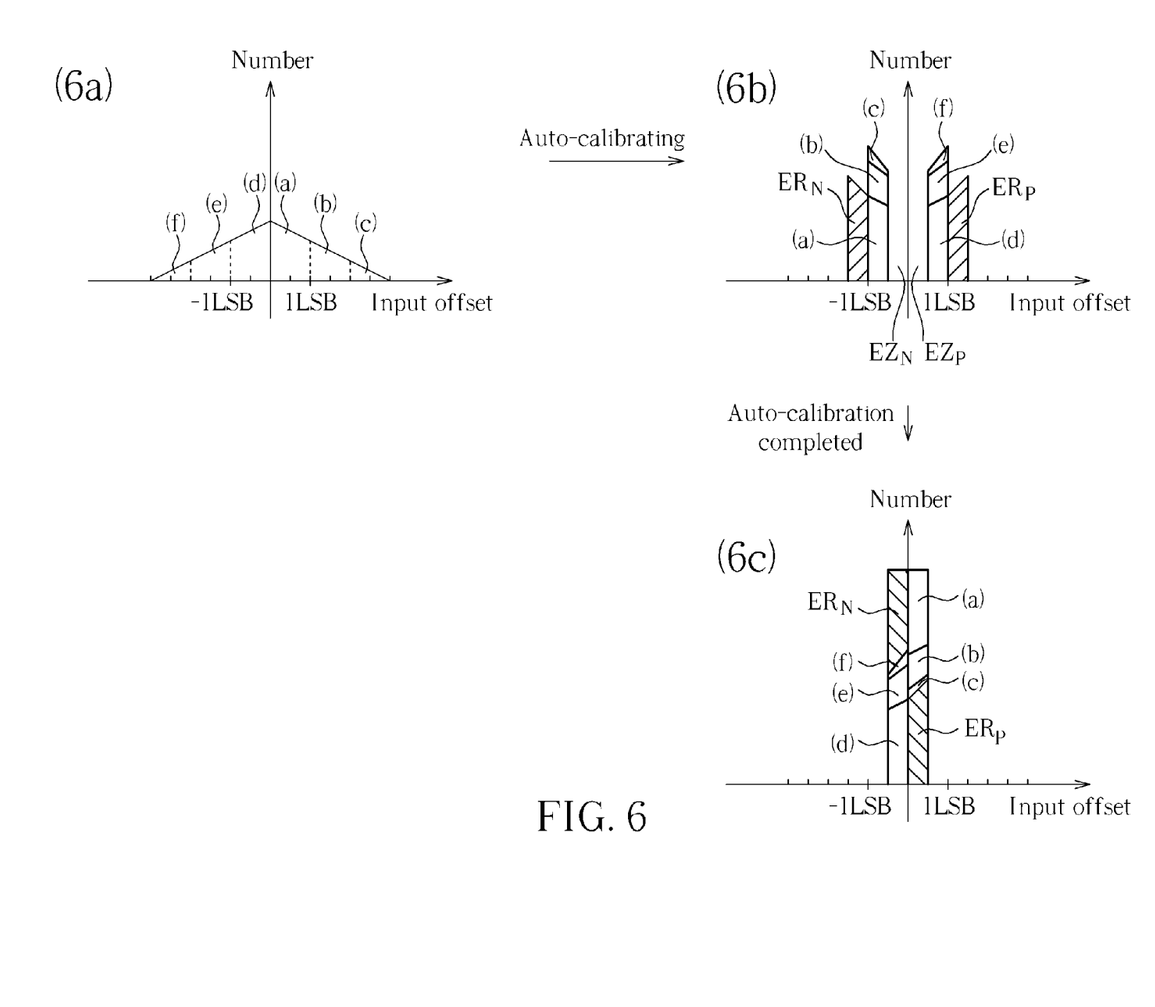
FIG. 6 is a schematic diagram illustrating the distribution of input offset voltage according to an embodiment of the present invention.

Therefore, please refer to FIG. 6. FIG. 6 is a diagram illustrating the distribution of input offset voltage according to an embodiment of the present invention. As shown in FIG. 6, a section 6(a) represents the distribution of the input offset voltage before calibration. Suppose the input resolution of the gain stage circuit 304 is 1 LSB, and the output transition time of the gain stage circuit 304 becomes longer when the input offset voltage is less than 0.5 LSB. Therefore, the present invention can perform a calibration process according to the count value C before the output signal of the gain stage circuit 304 changes state. In such a condition, please further refer to the section 6(b) of FIG. 6. Because the input offset voltage being calibrated to the range between −0.5 LSB and 0.5 LSB is most easily over-calibrated, this means that the input offset voltage which had already been calibrated to the empty zones $EZ_N$ (from −0.5 LSB to zero) would be further over-calibrated into an error zone $ER_P$, and the input offset voltage which had already been calibrated to the empty zones $EZ_P$ (from zero to 0.5 LSB) would be further over-calibrated into an error zone $ER_N$, so as to cause the calibrated input offset to exceed the allowable offset value (precession). Since the size of the error calibration range (i.e. the empty zones $EZ_P$ or the empty zones $EZ_N$ shown in FIG. 6) is 0.5 LSB, the compensation value $C_C$ can be 1 LSB $$\left(C_c = 0.5 LSB + \frac{1 LSB}{2} = 1 LSB\right).$$

After that, the zero offset compensation unit 404 can provide the final count value $C_F$ according to the compensation value $C_C$ and the count value C for the following calibration process after the output signal of the gain stage circuit 304 changes state. As shown in section 6(c) of FIG. 6, the input offsets in the over-calibrated error zone $ER_P$ and the zones (d), (e), (f) can be left shifted 1 LSB ($C_F$=C−1 LSB). Similarly, the input offsets in the over-calibrated error zone $ER_N$ and the zones (a), (b), (c) can be right shifted 1 LSB ($C_F$=C+1 LSB). As can been seen, the calibration precision can be reduced to within 0.5 LSB (between −0.5 LSB and 0.5 LSB), as shown in the section 6(c) of FIG. 6. Therefore, the present invention can overcome the drawback of the prior art through setting an appropriate compensation value according to each amplifier type for precision input offset calibration, so that the offset voltage calibration apparatus 306 is capable of obtaining a lowest input offset voltage and the distribution of the input offset voltage will be concentrated at the zero offset point.

Figure 7:
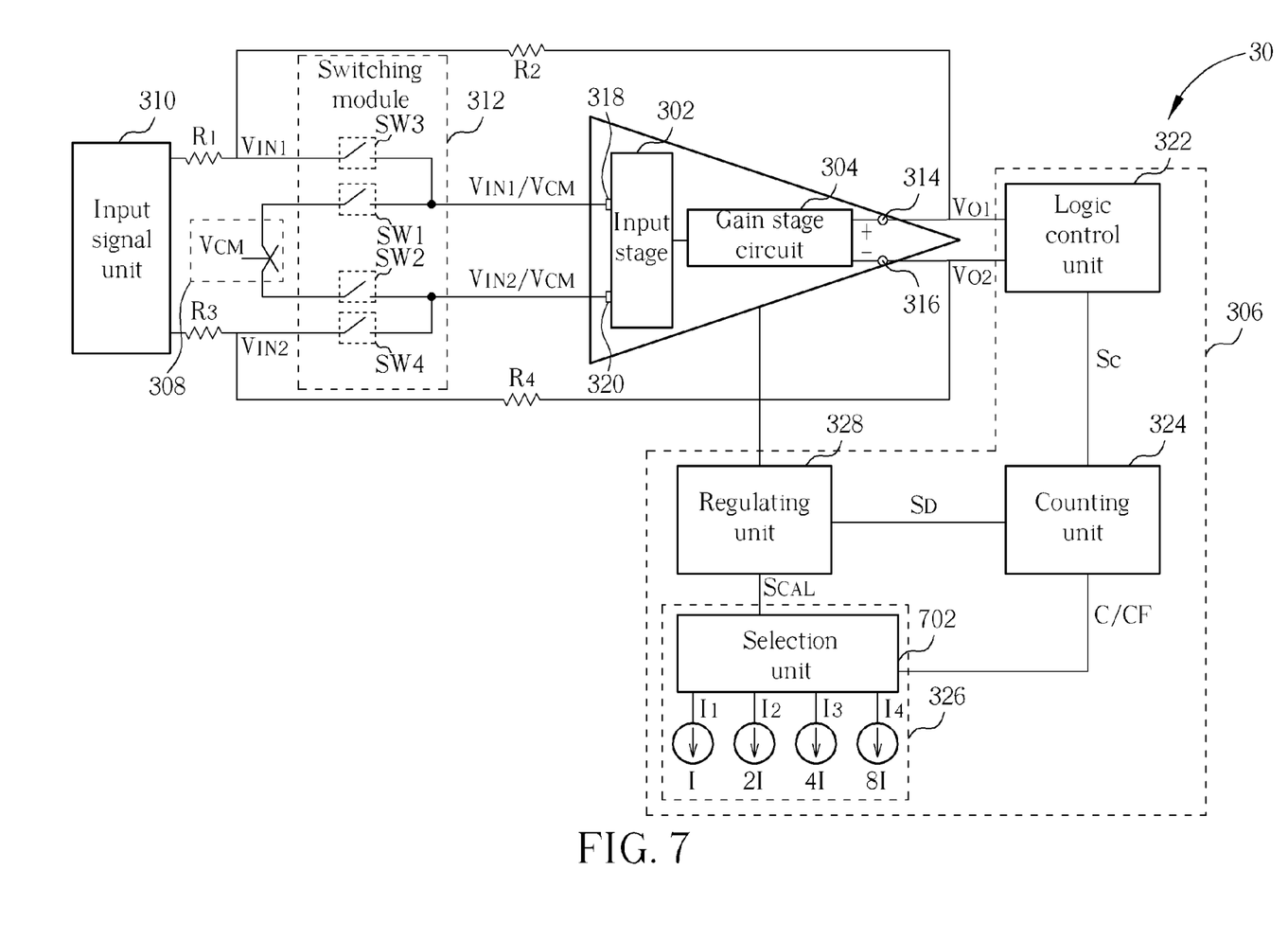
FIG. 7 is a schematic diagram of the calibration signal generation unit shown in FIG. 3 according to an embodiment of the present invention.

In addition, please refer to FIG. 7, which is a schematic diagram of the calibration signal generation unit 326 shown in FIG. 3 according to an embodiment of the present invention. The calibration signal generation unit 326 includes a selection unit 702 and current sources I, 2I, 4I, 8I. The current sources I, 2I, 4I, 8I are coupled to the selection unit 702, and are respectively utilized for providing weighted current signals $I_1$, $I_2$, $I_3$, $I_4$. The selection unit 702 is utilized for controlling whether the current signals $I_1$, $I_2$, $I_3$, $I_4$ can be passed through the selection unit 702 before (after) the output of the gain stage circuit 304 changes state according to the count value (the final count value $C_F$) in order to generate the corresponding calibration signal $S_{CAL}$. On the other hand, the switching module 312 includes a first switch SW1, a second switch SW2, a third switch SW3, and a fourth switch SW4. The interconnections of the switches are as shown in FIG. 7, so detailed descriptions are omitted here for the sake of brevity. The switching module 312 utilizes the conducting or cut off operations of the switches for arranging the input signals of the gain stage circuit 304. For instance, when the amplifier 30 operates in a normal operation mode (during the normal period), the third switch SW3 and the fourth switch SW4 are switched to a conducting state, and the other switches are kept in an off state. In such a condition, the gain stage circuit 304 serves as a common amplifier for implementing normal amplifier functions. When the amplifier 30 operates in a calibration mode (during the calibration period), the first switch SW1 and the second switch SW2 are switched to a conducting state, and the other switches are preserved in an off state. In such a condition, the gain stage circuit 304 is changed into an open loop operation configuration and serves as a comparator.

Figure 8:
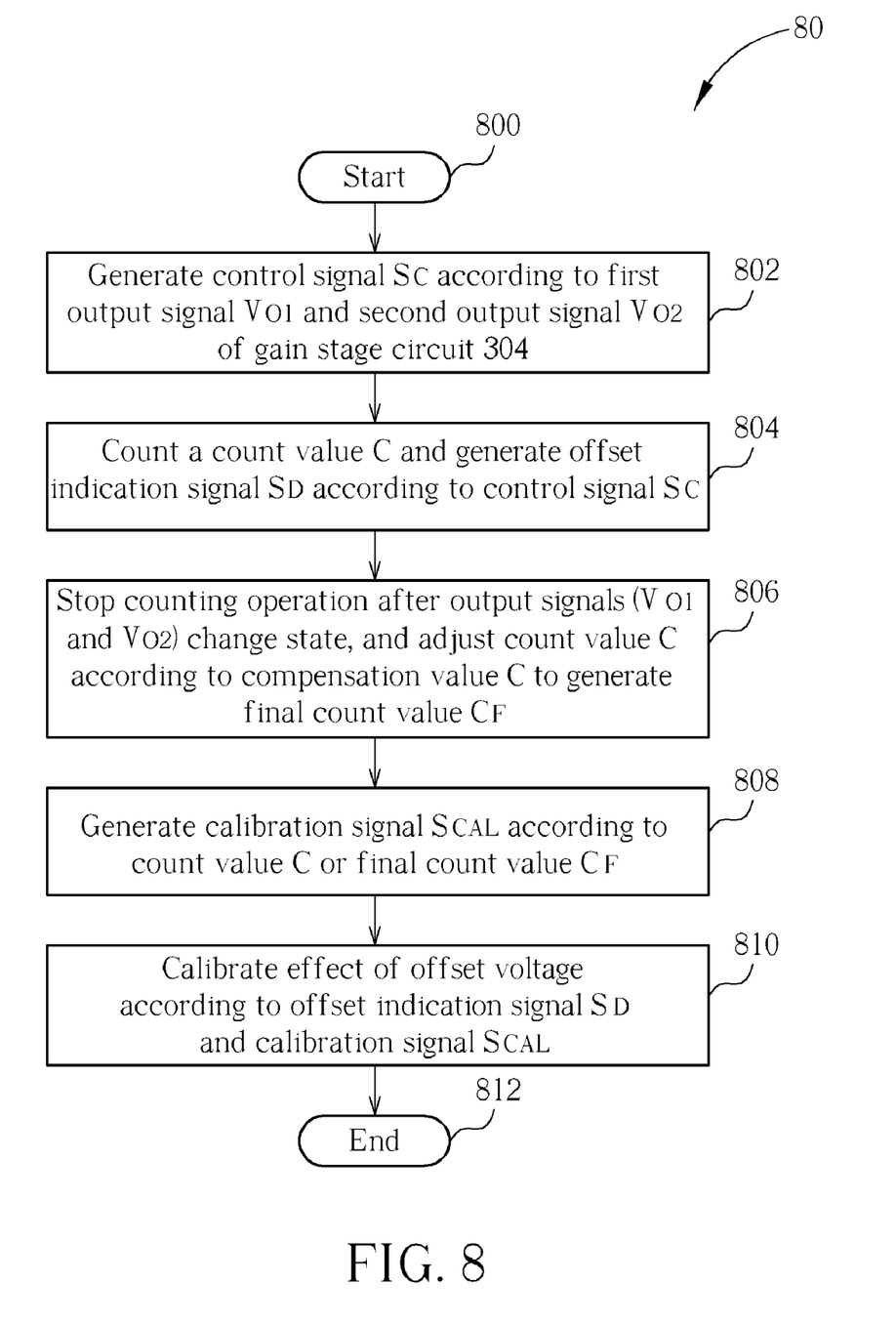
FIG. 8 is a schematic diagram of an offset voltage calibration procedure according to an embodiment of the present invention.

Please refer to FIG. 8, which is a schematic diagram of an offset voltage calibration procedure 80 according to an embodiment of the present invention. The offset voltage calibration procedure 80 is utilized for illustrating an operation procedure of the offset voltage calibration apparatus 306 for describing the spirit of the present invention more clearly. The offset voltage calibration procedure 80 comprises the following steps:

Step 800: Start.
Step 802: Generate control signal $S_C$ according to first output signal $V_{O1}$ and second output signal $V_{O2}$ of gain stage circuit 304
Step 804: Count a count value C and generate offset indication signal $S_D$ according to control signal $S_C$.
Step 806: Stop counting operation after output signals ($V_{O1}$ and $V_{O2}$) change state, and adjust count value C according to compensation value C to generate final count value $C_F$.
Step 808: Generate calibration signal $S_{CAL}$ according to count value C or final count value $C_F$.
Step 810: Calibrate effect of offset voltage according to offset indication signal $S_D$ and calibration signal $S_{CAL}$.
Step 812: End.

The offset voltage calibration procedure 80 is utilized for illustrating the implementation of the offset voltage calibration apparatus 306. Related variations and the detailed description can be referred from the foregoing description, so as not to be narrated herein.

Note that, the offset voltage calibration apparatus 306 is an exemplary embodiment of the present invention, and those skilled in the art can make alternations and modifications accordingly. For example, the offset voltage calibration apparatus 306 and related operation scheme can be utilized for any electronic device having DC input offset voltage, such as amplifier circuits, charge pump circuits, etc., for calibrating the DC input offset effect. In addition, the first input signal $V_{IN1}$ and the second input signal $V_{IN2}$ are complementary signals, and the second output signal $V_{O2}$ is the inverted first output signal $V_{O1}$. The amount and magnitude of current signals of the calibration signal generation unit 326 depend on system design.

In summary, in contrast to the prior art, the present invention can reduce the input offset voltage without the occurrence of an empty zone, and achieve the purpose of more precise calibration, so as to enhance overall circuit system performance effectively.

Those skilled in the art will readily observe that numerous modifications and alterations of the device and method may be made while retaining the teachings of the invention.

What is claimed is:
1. An offset voltage calibration method for calibrating an offset voltage of an electronic device during a calibration period, the offset voltage calibration method comprising:
  generating a control signal according to an output signal of the electronic device;
  counting a count value and generating an offset indication signal according to the control signal;

stopping counting the count value and adjusting the count value according to a compensation value to generate a final count value after the output signal changes state;

generating a calibration signal according to the count value or the final count value; and calibrating the offset voltage according to the offset indication signal and the calibration signal.

2. The offset voltage calibration method of claim 1, wherein the step of counting the count value and generating the offset indication signal according to the control signal comprises selectively up-counting or down-counting the count value according to the control signal and generating the offset indication signal according to the control signal.

3. The offset voltage calibration method of claim 2, wherein the step of stopping counting the count value after the output signal changes state and adjusting the count value according to the compensation value to generate the final count value comprises:

stopping counting the count value after the output signal changes state; and performing a subtraction calculation on the count value and compensation value to generate the final count value when the count value is up-counted before the output signal changes state.

4. The offset voltage calibration method of claim 2, wherein the step of stopping counting the count value after the output signal changes state and adjusting the count value according to the compensation value to generate the final count value comprises:

stopping counting the count value after the output signal changes state; and performing an addition calculation on the count value and compensation value to generate the final count value when the count value is down-counted before the output signal changes state.

5. The offset voltage calibration method of claim 2, wherein the step of up-counting or down-counting the count value according to the control signal comprises up-counting or down-counting the count value by one increment or decrement according to the control signal.

6. The offset voltage calibration method of claim 1, wherein the compensation value is less than or equal to one least significant bit.

7. The offset voltage calibration method of claim 1, wherein the compensation value is equal to the sum of size of an error calibrated zone and half of resolution of the electronic device.

8. The offset voltage calibration method of claim 1, wherein the step of generating the calibration signal according to the count value or the final count value comprises:

generating the calibration signal according to the count value before the output signal changes state; and generating the calibration signal according to the final count value after the output signal changes state.

9. The offset voltage calibration method of claim 1, wherein the step of generating the calibration signal according to the count value or the final count value comprises:

controlling whether a plurality of current signals are passed through a selection unit to generate the calibration signal according to the count value or the final count value.

10. The offset voltage calibration method of claim 1, wherein the electronic device is an amplifier circuit or a charge pump circuit.

11. An offset voltage calibration apparatus for calibrating an offset voltage of an electronic device during a calibration period, the offset voltage calibration apparatus comprising:

a logic control unit for generate a control signal according to an output signal of the electronic device;

a counting unit coupled to the logic control unit for counting a count value and generating an offset indication signal according to the control signal, stopping counting the count value and adjusting the count value according to a compensation value to generate a final count value after the output signal changes state;

a calibration signal generation unit coupled to the counting unit for generating a calibration signal according to the count value or the final count value; and a regulating unit coupled to the counting unit, the calibration signal generation unit, and the electronic device for calibrating the offset voltage according to the offset indication signal and the calibration signal.

12. The offset voltage calibration apparatus of claim 11, wherein the counting unit comprises:

an up/down counter coupled to the logic control unit for selectively up-counting or down-counting the count value according to the control signal, and stopping counting the count value after the output signal changes state;

a zero offset compensation unit coupled to the up/down counter for generating the final count value according to the count value and the compensation value after the output signal changes state; and an offset determination unit coupled to the logic control unit for generating the offset indication signal according to the control signal to indicate offset situation of the offset voltage;

wherein the final count value is equal to the difference of the compensation value and the count value when the up/down counter up-counts the count value before the output signal changes state, and the final count value is equal to the sum of the count value and the compensation value when the up/down counter down-counts the count value before the output signal changes state.

13. The offset voltage calibration apparatus of claim 12, wherein the up/down counter up-counts or down-counts the count value by one increment or decrement according to the control signal.

14. The offset voltage calibration apparatus of claim 12, wherein the compensation value is less than or equal to one least significant bit.

15. The offset voltage calibration apparatus of claim 12, wherein the compensation value is equal to the sum of size of an error correction zone and half of resolution of the electronic device.

16. The offset voltage calibration apparatus of claim 12, wherein the calibration signal generation unit generates the calibration signal according to the count value before the output signal changes state and generates the calibration signal according to the final count value after the output signal changes state.

17. The offset voltage calibration apparatus of claim 16, wherein the calibration signal generation unit comprises:

a plurality of current sources for providing a plurality of current signals; and a selection unit coupled to the counting unit and the plurality of current sources for controlling whether the plurality of current signals are passed through the selection unit to generate the calibration signal according to the count value or the final count value.

18. The offset voltage calibration apparatus of claim 12, wherein the electronic device is an amplifier circuit or a charge pump circuit.

19. An amplifier capable of auto-calibrating offset voltage, comprising:
- an input stage comprising a first input end and a second input end for receiving a common mode voltage signal respectively during a calibration period;
- a gain stage circuit coupled to the input stage for generating an output signal according to the common mode voltage signal received by the first input end and the second input end; and
- an offset voltage calibration apparatus for calibrating an offset voltage of the amplifier device during the calibration period, the offset voltage calibration apparatus comprising:
  - a logic control unit coupled to the gain stage circuit for generating a control signal according to the output signal;
  - a counting unit coupled to the logic control unit for counting a count value and generating an offset indication signal according to the control signal, stopping counting the count value and adjusting the count value according to a compensation value to generate a final count value after the output signal changes state;
  - a calibration signal generation unit coupled to the counting unit for generating a calibration signal according to the count value or the final count value; and
  - a regulating unit coupled to the counting unit, the calibration signal generation unit, and the gain stage circuit for calibrating the offset voltage according to the offset indication signal and the calibration signal.

20. The amplifier of claim 19 further comprising:
- a common mode input unit for providing the common mode voltage signal;
- an input signal unit comprising a first signal end and a second end for providing a first input signal and a second input signal respectively; and
- a switching module coupled to the input stage, the input signal unit, and the common mode input unit for conducting the connection between the input stage and the input signal unit during a normal period to provide the first input signal and the second input signal to the first input end and the second input end, respectively, or conducting the connection between the input stage and the common mode input unit during the calibration period to provide the common mode voltage signal to the first input end and the second input end, respectively.

21. The amplifier of claim 20, wherein the switching module comprises:
- a first switch comprising a first end coupled to a first common mode voltage end of the common mode input unit and a second end coupled to the first input end;
- a second switch comprising a first end coupled to a second common mode voltage end of the common mode input unit and a second end coupled to the second input end;
- a third switch comprising a first end coupled to the first signal end of the input signal unit and a second end coupled to the first input end; and
- a fourth switch comprising a first end coupled to the second signal end of the input signal unit and a second end coupled to the second input end.

22. The amplifier of claim 21, wherein the first switch and second switch are switched on and the third switch and fourth switch are switched off during the normal period.

23. The amplifier of claim 21, wherein the first switch and second switch are switched off and the third switch and fourth switch are switched on during the calibration period.

24. The amplifier of claim 20, wherein the counting unit comprises:
- an up/down counter coupled to the logic control unit for selectively up-counting or down-counting the count value according to the control signal, and stopping counting the count value after the output signal changes state;
- a zero offset compensation unit coupled to the up/down counter for generating the final count value according to the count value and the compensation value after the output signal changes state; and
- an offset determination unit coupled to the logic control unit for generating the offset indication signal according to the control signal to indicate offset situation of the offset voltage;
- wherein the final count value is equal to the difference of the compensation value and the count value when the up/down counter up-counts the count value before the output signal changes state, and the final count value is equal to the sum of the count value and the compensation value when the up/down counter down-counts the count value before the output signal changes state.

25. The amplifier of claim 20, wherein the up/down counter up-counts or down-counts the count value by one increment or decrement according to the control signal.

26. The amplifier of claim 20, wherein the compensation value is less than or equal to one least significant bit.

27. The amplifier of claim 20, wherein the compensation value is equal to the sum of size of an error correction zone and half of resolution of the electronic device.

28. The amplifier of claim 20, wherein the calibration signal generation unit generates the calibration signal according to the count value before the output signal changes state and generates the calibration signal according to the final count value after the output signal changes state.

29. The amplifier of claim 28, wherein the calibration signal generation unit comprises:
- a plurality of current sources for providing a plurality of current signals; and
- a selection unit coupled to the counting unit and the plurality of current sources for controlling whether the plurality of current signals are passed through the selection unit to generate the calibration signal according to the count value or the final count value.

* * * * *